(12) United States Patent
Badzian et al.

(10) Patent No.: US 6,200,183 B1
(45) Date of Patent: Mar. 13, 2001

(54) APPLICATION OF ELECTRON FIELD EMISSION FROM DIAMOND GROWN BY A MULTIPLE PULSED LASER PROCESS

(75) Inventors: Andrzej R. Badzian; Rustum N. Roy; Theresa Badzian; William R. Drawl, all of State College, PA (US); Pravin Mistry, Dearborn; Manuel C. Turchan, Northville, both of MI (US)

(73) Assignee: QQC, Inc., Dearborn, MI (US)

( * ) Notice: Subject to any disclaimer, the term of this patent is extended or adjusted under 35 U.S.C. 154(b) by 0 days.

(21) Appl. No.: 09/357,622

(22) Filed: Jul. 20, 1999

Related U.S. Application Data

(60) Provisional application No. 60/093,462, filed on Jul. 20, 1998.

(51) Int. Cl.[7] ................................................. H01J 9/02
(52) U.S. Cl. ................................................. 445/24; 445/51
(58) Field of Search .................................. 313/310, 311; 445/24, 51

(56) References Cited

U.S. PATENT DOCUMENTS

| | | | |
|---|---|---|---|
| 4,685,976 | * 8/1987 | Schachameyer et al. | ........... 437/173 |
| 5,154,945 | * 10/1992 | Baldwin et al. | ...................... 427/596 |
| 5,308,651 | * 5/1994 | Ohta et al. | ............................ 427/582 |
| 5,445,550 | * 8/1995 | Xie et al. | ............................... 445/24 |
| 5,643,641 | * 7/1997 | Turchan et al. | ...................... 427/595 |
| 5,891,522 | * 4/1999 | Olson | .................................. 427/309 |

* cited by examiner

*Primary Examiner*—Kenneth J. Ramsey
(74) *Attorney, Agent, or Firm*—Harness, Dickey & Pierce, P.L.C.

(57) ABSTRACT

The preparation and use of diamond as an electron emission material is disclosed. Satisfactory measurements were conducted on diamond coatings deposited on WC-Co alloy by a multiple pulsed laser process. The electron emission was measured in a diode configuration with a diamond surface-anode spacing of 20 and 50 $\mu$m in vacuum at $P=10^{-7}$ Torr. Current densities of 6 mA/cm were calculated at an applied of voltage of 3000 V (for 20 $\mu$m). Analysis proved that electron field emission provided by a diamond grown by a multiple pulsed laser process proved to satisfactorily meet the specified demands.

7 Claims, 4 Drawing Sheets

APPLICATION OF ELECTRON FIELD EMISSION FROM DIAMOND GROWN BY A MULTIPLE PULSED LASER PROCESS

This appln claims the benefit of Provisional No. 60/093,462 filed Jul. 20, 1998.

TECHNICAL FIELD

The present invention is generally directed to electron emission materials. More particularly, the present invention is directed to the use of diamond as an electron emission material.

BACKGROUND ART

There has been great interest in fabricating cold cathodes using wide-band-gap semiconductors. Such material has been used as coatings on metallic tips, as tip materials, and as thin-film cold cathodes. Materials of current interest include among others diamond, nitrides, disordered carbon forms, and others.

Electron emission is achievable in many ways from a variety of materials and several mechanisms have been proposed to explain the phenomenon. For example, a disordered tetrahedral carbon thin-film device using a diode configuration has been successfully demonstrated in applications for such purposes. (To this purpose see the article by B. L. Weiss, A. Badzian, L. Pilione, T. Badzian, and W. Drawl, Appl. Phys. Lett. 71, 794 (1997).) This material seems to satisfy the provide the following qualities:

(i) electronic structure characteristics of wide-band-gap semiconductors;

(ii) high dielectric breakdown;

(iii) n-type electrical conductivity;

(iv) favorable emission surface properties, including negative electron affinity and/or emission enhancement by adsorbed specific atoms; and (v) durability under a high electrical field, including longevity in thousands of hours.

In general, diamond material fulfills these conditions as is demonstrated in the extensive electron emission art. Examples include: U.S. Pat. No. 3,947,716, issued on Mar. 30, 1976, to Fraser, Jr. et al.; U.S. Pat. No. 3,970,887, issued on Jul. 20, 1976, to Smith et al.; U.S. Pat. No. 4,307,507, issued on Dec. 29, 1981, to Gray et al.; U.S. Pat. No. 4,685,996, issued on Aug. 11, 1987, to Busta et al.; U.S. Pat. No. 4,955,636, issued on Aug. 8, 1989, to Busta et al.; U.S. Pat. No. 4,964,946, issued on Oct. 23, 1990, to Gray et al.; and U.S. Pat. No. 5,703,435, issued Dec. 30, 1997.

According to some of the teachings of the art, chemical vapor deposition (CVD) methods were used in the fabrication of emission devices because of their versatility.

Of these requirements, the most difficult to achieve is the n-type diamond, preferably as a shallow donor material. However, n-type diamond was reported as a result of P (phosphorous) doping of (111) homoepitaxial thin films. In this investigation, Hall measurements were taken and an activation energy of 0.46 eV was calculated. (See S. Koizumi, M. Kamo, Y. Sato, H. Ozaki, and T. Inuzuka, Appl. Phys. Lett. 71 (1997) at 1065.)

While providing arguable improvements in the art, the prior art fails to provide a practical method of providing a diamond suitable for providing electron field emission. Such a method remains wanting.

SUMMARY OF THE INVENTION

Accordingly, it is an object of the present invention to provide for the use of a material which is generally satisfactory as an electron emission material.

It is an additional object of the present invention to provide for the use of such a material which provides an electronic structure characteristics of wide-band-gap semiconductors.

Still a further object of the present invention is to provide for the use of such a material which demonstrates high dielectric breakdown.

Yet an additional object of the present invention is to provide for the use of such a material which demonstrates n-type electrical conductivity.

A further object of the present invention is to provide for the use of such a material which demonstrates favorable emission surface properties, including negative electron affinity and/or emission enhancement by adsorbed specific atoms.

Still a further object of the present invention is to provide for the use of such a material which demonstrates durability under a high electrical field, including longevity in thousands of hours.

These and other objects are provided in the present invention through the use of diamond as an electron emission material. Satisfactory measurements were conducted on diamond coatings deposited on WC-Co alloy by a multiple pulsed laser process. The electron emission was measured in a diode configuration with a diamond surface-anode spacing of 20 and 50 $\mu$m in vacuum at P=$10^{-7}$ Torr. Current densities of 6 mA/cm were calculated at an applied voltage of 3000 V (for 20 $\mu$m). Analysis proved that electron field emission provided by a diamond grown by a multiple pulsed laser process proved to satisfactorily meet the specified demands.

BRIEF DESCRIPTION OF THE DRAWINGS

The present invention will be more fully understood by reference to the following detailed description of the preferred embodiments of the present invention when read in conjunction with the accompanying drawings in which.

DETAILED DESCRIPTION OF THE PREFERRED EMBODIMENT

Among wide-band-gap materials, diamond has been tested extensively in many laboratories for its applicability as an electron emission material. The results are encouraging but also point out the necessity of modifying the diamond films with respect to their chemical composition and/or atomic structure to meet the particular demands of the specific application. The present invention relates to the preparation and use of diamond film and sets forth field electron emission results obtained from diamond films grown by a multilaser process using a similar diode geometry. Set forth are also electron emission measurements conducted on such diamond coatings deposited on WC-Co alloy by a multiple pulsed laser process.

Test Samples

Figure 1A:
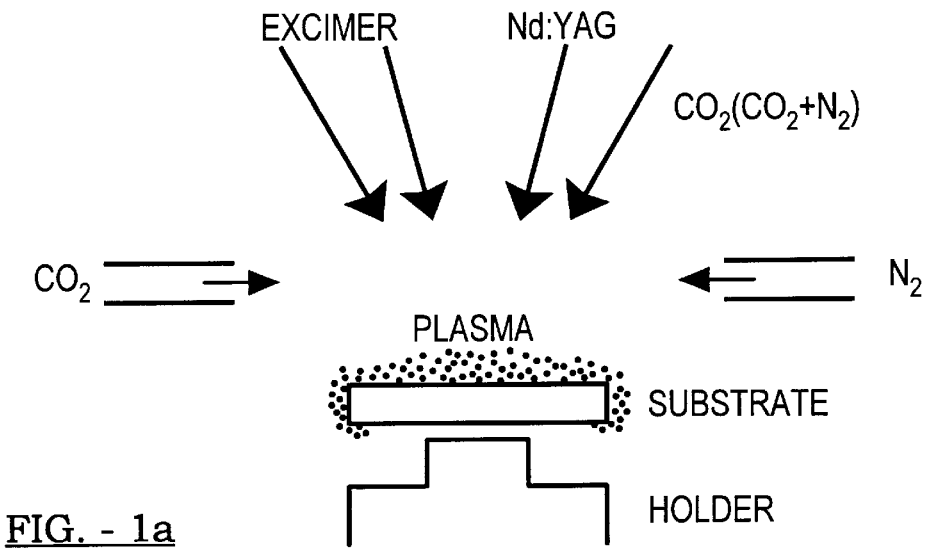
FIG. 1*a* is a schematic illustration of the process according to the present invention.
Figure 1B:
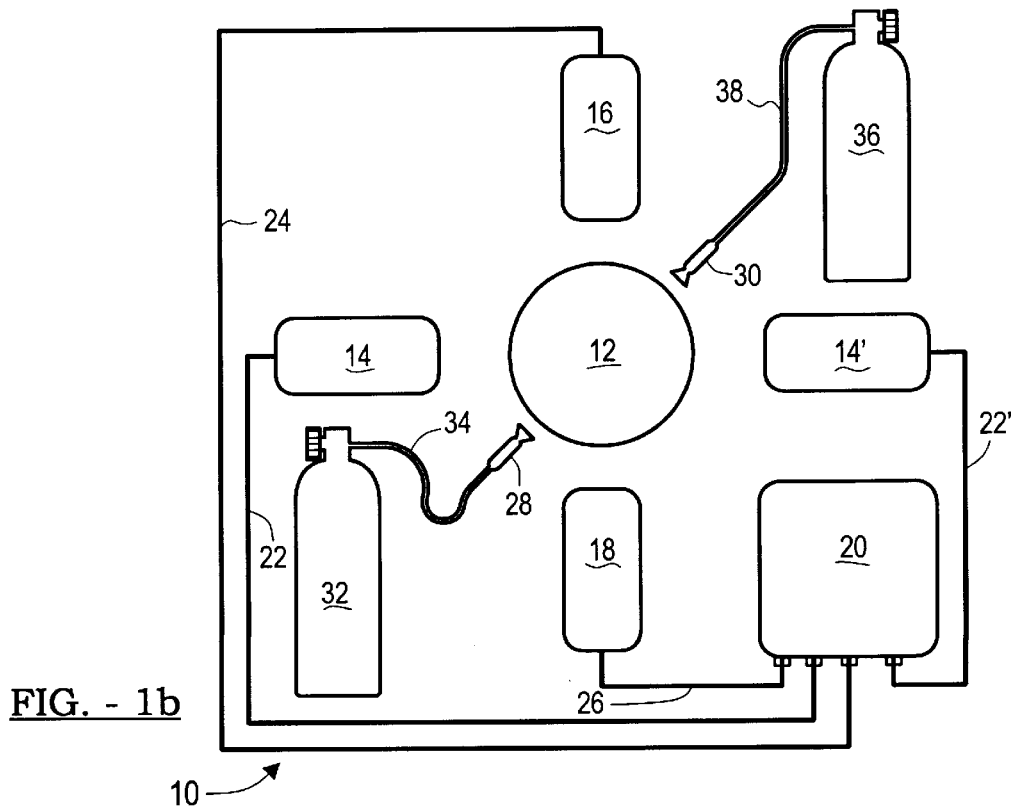
FIG. 1*b* is a plan view of a sample preparation station for fabricating the film-coated sample used for investigation in the present invention.

FIG. 1a discloses a schematic illustration of the process according to the present invention. The lasers and gases are illustrate in relation to the substrate. FIG. 1b discloses a plan view of a sample preparation station, generally illustrated as 10, which was established for the preparation of a substrate for study and application in the present invention. A substrate support 12 is centrally disposed surrounded by an array of lasers. The lasers of choice include two excimer lasers 14, 14', one YAG:Nd laser 16, and one $CO_2$ laser 18. An alternate array of lasers having a different composition may be substituted for the described array, provided substantially the same results are achieved. However, these particular lasers were selected after due experimentation as having sufficient power to ignite the plasma which engulfs the substrate as set forth hereinafter.

A CPU 20 is provided for selectively operating the lasers 14, 14', 16, and 18 according to a prepared program. The excimer lasers 14, 14' are operatively associated with the CPU 20 via a pair of cables 22, 22'. The YAG:Nd laser 16 is operatively associated with the CPU 20 via a cable 24. The $CO_2$ laser 18 is operatively associated with the CPU 20 via a cable 26.

The station is established in an open air environment. (This was found to work for the selected WC-Co substrate material.) An array of gas jets 28, 30 is also disposed around the support 12. The gas jet 28 is operatively associated with a source of $N_2$ gas 32 via a gas conduit 34. The gas jet 30 is operatively associated with a source of $CO_2$ gas 36 via a gas conduit 38.

A sample substrate (not shown) was selected and placed on the substrate support 12. The selected samples were WC-Co inserts for cutting tools generally having widths of about 15 mm although it is to be understood that a variety of sample substrates could be selected. Once the sample substrate was placed on the support 12, selected quantities of the $N_2$ and $CO_2$ gases were delivered to shroud the substrate radially. No hydrogen is involved. The lasers 14, 14' 16, and 18 were then activated and were are operated in their pulsing modes as directed by the program of the CPU 20. The focused lasers 14, 14', 16, and 18 were guided by drive motors (not shown) to move across the substrate surface in a programmed manner as dictated by the CPU 20.

During the operation, a luminous plasma is created a few mm above the surface of the substrate which itself undergoes surface melting. The sequence of the laser pulse width and pulse frequency are adjusted as elements of the process parameters. The duration of the deposition process is generally about 40 s, and this length of time was employed in the preparation of the test sample. (Normally it takes about 40 s to coat the WC-Co insert with an area of 1.5 $cm^2$.) During this time the growth rate approaches 1 $\mu m/s$ and the resulting diamond film was shown to have a thicknesses of between 20 and 40 $\mu m$. Of course, it is to be understood that variations of the parameters including laser time and pulse rate effect variations of the growth rate and resulting film thickness. A more complete discussion of the process and its history may be found in co-pending U.S. Ser. No. 09/357,621, filed concurrent with the present application.

Preliminary analysis disclosed that the diamond coatings were electrically conductive because of doping with W and Co during the growth process. Electrical resistivity was found to be in the range of $M\Omega$ and the WC-Co substrate is considered as a metallic electrode.

Diamond Coatings And The Interface

Diamond coatings obtained by the above-described mannerwere found to have polycrystalline structures with grain sizes of about 10 $\mu m$. The top surface shows faceted crystals which contributed to the roughness of the coatings.

Figure 2:
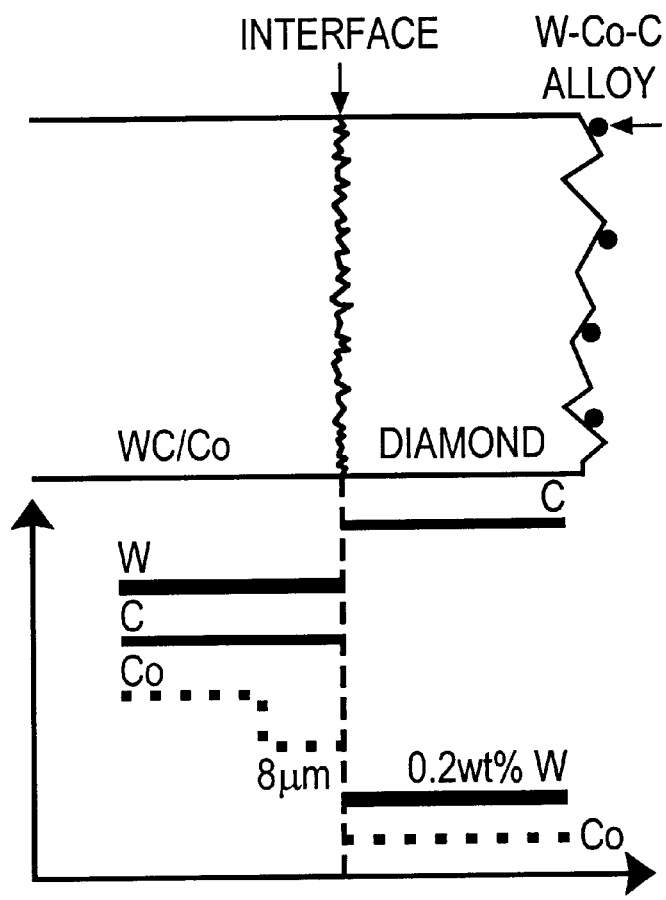
FIG. 2 is a schematic of a cross-section of a diamond-WC-Co interface showing concentration profiles of C, W, and Co obtained by an electron microscope.

(a) Chemical analysis was performed using electron microprobe and X-ray photoelectron spectroscopy (XPS) for the top surface and electron microprobe for the cross section. The schematic describing the results of the electron microprobe analysis is shown in FIG. 2. As illustrated and as may be understood, there is an abrupt change in the composition at the interface. W is detected at a constant level of 0.2 wt % and is uniformly distributed in the diamond on the atomic level. No inclusions were found. An 8 $\mu m$ layer depleted in Co was found on the WC-Co side of the interface. The Co content in diamond is measurable but it stays below the W concentration. The carbon content is steady throughout the WC-Co side and no enrichment in C is observed at the interface. In addition, no enrichment is found in W on the diamond side.

(b) X-ray diffraction (Cu K$\alpha$) registers 111, 220, 311, 400, and 331 peaks of cubic diamond. These values are consistent with the lattice constant a=0.3567±0.0001 nm. The coatings differ in the degree of long-range order, as was observed in the profiles broadening of the reflections (e.g., 331). (See, in addition, A. Badzian, R. Roy, P. Mistry, and M. C. Turchan, in *The Physics of Diamond*, Proceedings of the International School of Physics "Enrico Fermi" Course, ed. XXXV, edited by A. Paoletti and A. Tucciarone (IOS, Amsterdam, 1997), pp. 195–208.) Diffraction peaks related to WC at the diamond-substrate interface become sharper after the growth process of diamond. It appears that recrystallization takes place during the laser treatment. In addition to evaporation of WC and Co, Co is almost removed from the surface.

(c) The position of the diamond Raman peak is shifted to 1336 $cm^{-1}$ indicating stress in the film. The Raman peak is broader, and this can be related to displacement disorder of the carbon atoms caused by contamination from the W, Co, and from static defects. All coatings show luminescence which differs from CVD diamond spectra.

The prepared coatings differed from CVD films in other respects, too. The top surface of coating is decorated by small particles (about 1 $\mu m$ and less in size) composed of W, Co, and C. This indicates the existence of metals on the surface, which was confirmed by XPS. This appears to have been formed by condensation from the vapor phase of metal-containing molecules. These particles do not appear to be emission centers.

Adhesion of the diamond to WC-Co is very strong, as determined by a Rockwell Superfacial Hardness Tester. Under the load of 45 kg applied for a Brale-C indentor, no cracking or delamination was observed.

Electron Emission Measurements

Figure 3:
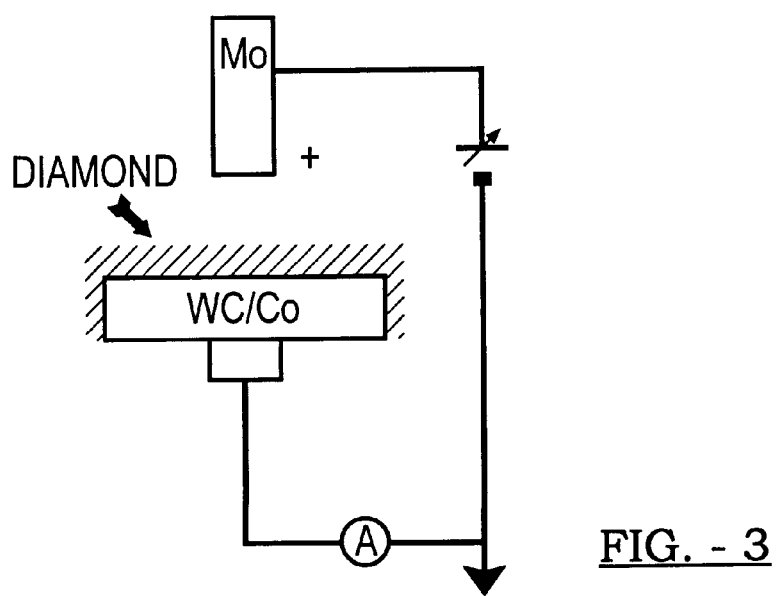
FIG. 3 is a schematic of an electronic emission measurement setup.

FIG. 3 illustrates a schematic of an electronic emission measurement setup used for emission sensing according to the present invention. Electron emission measurements were performed on the sample described above. The measurements were carried out in a high vacuum chamber with a base pressure of $P=2\times10^{-7}$ Torr. The emission measurements were carried out at anode-diamond film spacing of 20 and 50 $\mu m$.

By defining a turn-on current of ~1 nA, this corresponds to the turn-on fields (F) of 35–50 V/$\mu m$. Here, F applied voltage/anode-film spacing.

The measurements at 20 $\mu m$ for a V=3000 V produced a total current of 1.5–2 mA. This corresponds to a current density (J)=4–6 $mA/cm^2$ where J=total current/anode collecting area.

Figure 4:
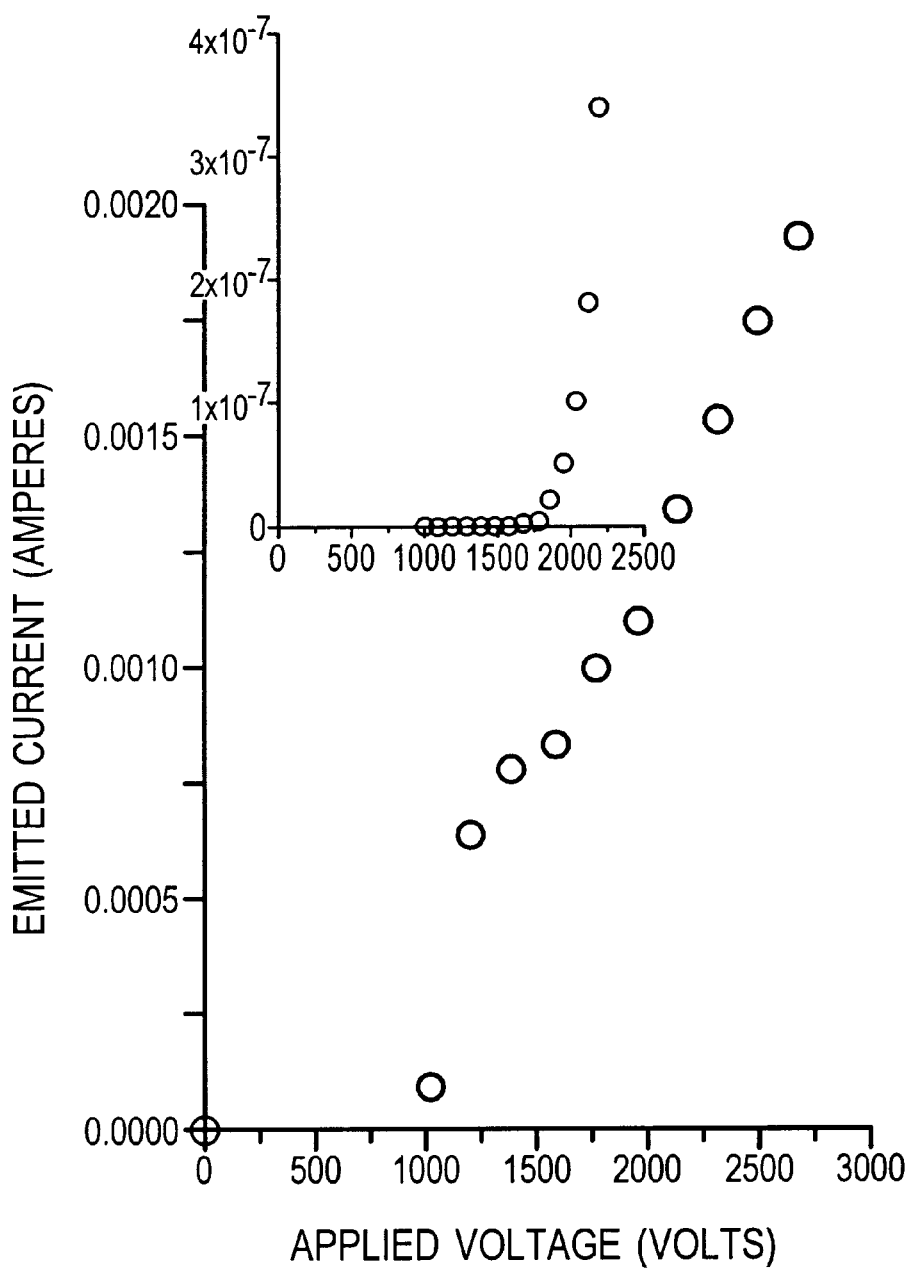
FIG. 4 demonstrates I–V characteristics of the diamond films prepared as set forth herein for use in the present invention for 20 $\mu$m spacing with an inset showing an I–V curve for 50 $\mu$m species.

FIG. 4 shows the I–V characteristics of the diamond films prepared as above for emission analysis according to the present invention. The large graph illustrates characteristics of these films for 20 μm spacing. The inset illustrates the I–V curve for the 50 μm species.

Figure 5:
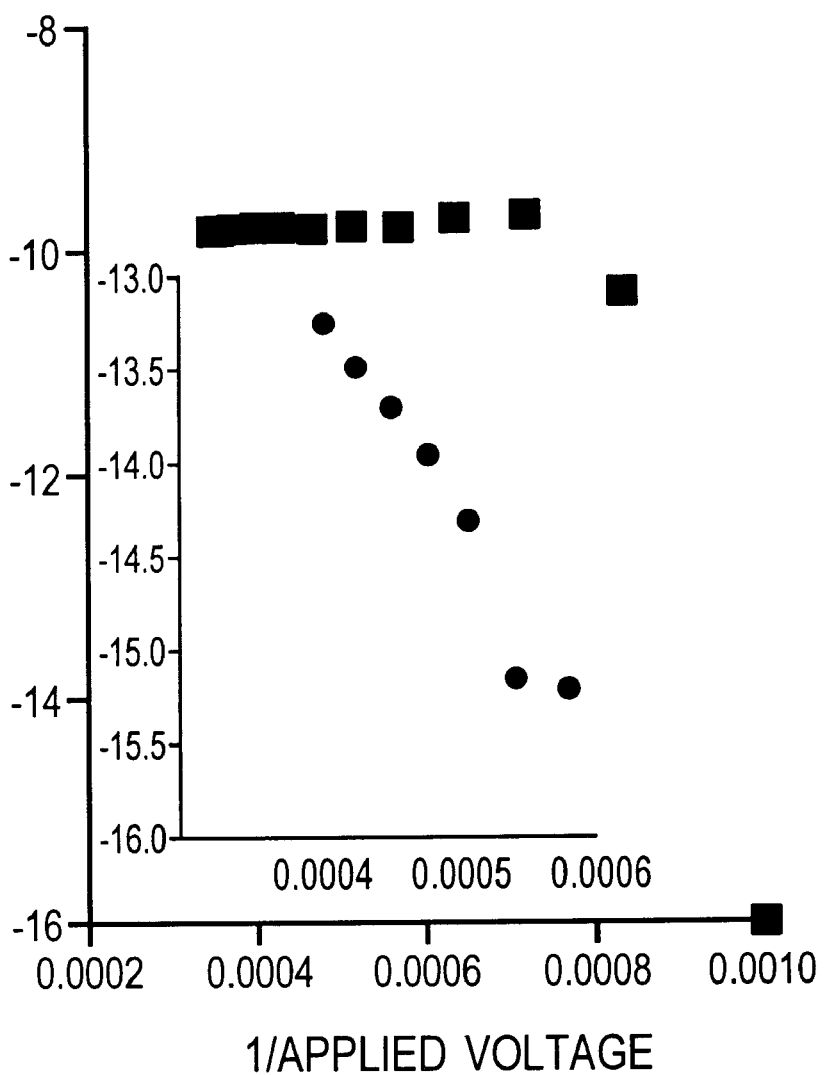
FIG. 5 disclose Fowler-Nordheim plots for I–V curves of FIG. 4 with an inset illustrating 5 $\mu$m spacing.

FIG. 5 shows the Fowler-Nordheim plots calculated for the I–V curves set forth in FIG. 4. Several items need to be noted when evaluating emission from the samples derived from the above-process. First, the fields at which the films are operating are considerably higher than those of current films reported in the literature. In spite of this, the current densities being calculated are valuable for practical applications. Also, the films did not break down at high fields (F~150 V/μm). (Measurements at higher voltages were limited by the failure of a protection circuit of the electronics used during analysis.)

General Analysis

There is a common agreement that diamond may have use as a an electron emitter material. Current knowledge focuses on the negative electron affinity of the diamond surfaces as a main factor in electron emission.

The conceptual models for electron emission from thin-film devices are under discussion now. Applicants speculate about the emission mechanism as follows. A Schottky barrier is formed at the diamond-WC-Co interface and the electrons tunnel from the substrate through this barrier into the diamond. In the diamond, electrons are moved quasi-ballistically within the conduction band. There appear to be the formation of local states in the gap, as a combined effect of W and Co doping and static defects, which can also tunnel into the conduction band. The electrons are subsequently injected into vacuum at the vacuum-film interface.

Historically, a description of internal field emission was given by A. G. Chynoweth in 1959. (Prog. Semicond. 4, 97 (1959)) Using this concept, C. A. Mead fabricated thin-film (0.1 μm) tunneling metalinsulator-metal devices. (J. Appl. Phys. 32, 648 (1961)) In the past, electron field emission has been used as a tool to study the cause(s) of dielectric breakdown in $SiO_2$. D. J. DiMaria et al. identified the role of metallic islands injectors at the silicon-$SiO_2$ interface on the enhancement of electron emission into vacuum. (D. J. DiMaria, T. N. Theis, J. R. Kirtley, F. L. Pesavento, D. W. Dong, and S. D. Brotson, J. Appl. Phys. 57, 1214 (1985)) Electron energy distribution measurements were possible due to this enhancement. (For a discussion on this point, see S. D. Brorson, D. J. DiMaria, M. V. Fischetti, F. L. Pesavento, P. M. Solomon, and D. W. Dong, J. Appl. Phys. 58, 1302 (1985).) These studies showed that the electrons exhibit quasiballistic transport of "hot" electrons through the conduction band of the semiconductor.

Electron energy distribution (EED) studies were performed on metal-insulator-semiconductor-metal devices, in which II–VI materials were used for the semiconductor layer. (Such studies include: R. Mach and G. O. Muller, J. Cryst. Growth 101, 967 (1990); J. Fitting, G.O. Muller, R. Mach, G. U. Reinsperger, Th. Hingst, and E. Schreiber, Phys. Status Solidi A 121, 305 (1990); and G. O. Muller, R. Mach, G. U. Reinsperger, E. Halden, and T. G. Schulz, J. Cryst. Growth 117, 948 (1992).) These studies showed a ballistic-like behavior. The measurements were conducted along with Monte Carlo simulations which confirmed the experimental findings. (See H. J. Fitting, J. Boyde, and J. Reinhardt, Phys. Status Solidi A 81, 323 (1984) and H. J. Fitting and A. Von Czarnowski, Phys. Status Solidi A 93, 385 (1986).) In addition, ballistic behavior of electrons in diamond has been reported by Cutler et al. (P. H. Cutler, Z. H. Huang, N. M. Miskovsky, P. D. Ambrosio, and N. M. Chung, J. Vac. Sci. Technol. B 14, 2020 (1996). EED studies on GaAs, up to 3 μm thick, have also been performed which have demonstrated similar ballistic nature. (See H. J. Fitting, Th. Hingst, E. Schreiber, and E. Beib, J. Vac. Sci. Technol. B 14, 2087 (1996).)

The recent development of cold cathodes based on diamond thin-film devices has been proposed by Yoder of the Office of Naval Research. (M. Yoder, Nav. Res. Rev. 44/3, 17 (1992)) The use of other wide-band-gap materials is being considered. Such materials potentially exhibit negative electron affinity, which can be a positive element in the field-emission process.

Conclusion

The data demonstrate that diamond-coated substrate prepared according to the method set forth above represents robust coatings suited for electron emission applications. These coatings 25–40 thick can withstand high electrical fields (~150 V/μm) and combine exceptional adherence of the diamond film to the substrate and electrical conductivity due to W and Co doping. A rough (in 1 μm range) interface and faceted crystals of diamond at the top surface forming vertices and edges can increase the emission. The top surface is covered by metals as a product of condensation of plasma species.

Electron field emission has been measured for polycrystalline diamond coatings obtained by the multiple laser growth process on WC-Co substrates. The emission current densities reached 6 mA/$Cm^2$ at an applied voltage 3 kV for a film-anode distance of 20 μm.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification and following claims.

What is claimed is:

1. A method for use of diamond as an electron field emission material, the method comprising the steps of:

forming a sample preparation station including a substrate support, an array of lasers disposed about said substrate support, a programmable CPU for operating said array of lasers, and an array of gas jets disposed about said substrate support;

placing a workpiece on said substrate support;

substantially engulfing said workpiece in said gas;

applying laser energy approximately to said workpiece;

removing said workpiece; and applying the finished workpiece in an operation which requires electron field emission.

2. The method of claim 1, wherein said step of forming said sample preparation station includes the steps of establishing said laser array by including an excimer lasers, a YAG:Nd laser, and a $CO_2$ laser.

3. The method of claim 1, wherein said step of forming said sample preparation station includes the steps of establishing said gas jet array by two gas jets.

4. The method of claim 2, wherein said two gas jets include a first jet operatively associated with a source of $N_2$ gas and a second jet operatively associated with a source of $CO_2$ gas.

5. The method of claim 1, wherein said workpiece consists of WC-Co.

6. The method of claim 1, wherein said preparation station is provided in an open air environment.

7. The method of claim 1, including the step of forming a luminous plasma is created a few mm above the surface of the workpiece during the lasering operation.

* * * * *